United States Patent
Yao

(10) Patent No.: US 11,209,464 B2
(45) Date of Patent: Dec. 28, 2021

(54) CURRENT DETECTION CIRCUIT AND POWER CONVERTER

(71) Applicant: Silergy Semiconductor Technology (Hangzhou) LTD, Hangzhou (CN)

(72) Inventor: Kaiwei Yao, Sunnyvale, CA (US)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/845,266

(22) Filed: Apr. 10, 2020

(65) Prior Publication Data
US 2020/0333379 A1 Oct. 22, 2020

(30) Foreign Application Priority Data
Apr. 18, 2019 (CN) .......................... 201910314114.6

(51) Int. Cl.
*G01R 15/00* (2006.01)
*G01R 19/00* (2006.01)
*H02M 1/00* (2006.01)

(52) U.S. Cl.
CPC ....... *G01R 15/002* (2013.01); *G01R 19/0092* (2013.01); *H02M 1/00* (2013.01); *H02M 1/0009* (2021.05)

(58) Field of Classification Search
CPC . H02M 1/00; H01M 4/00; H02H 1/00; G01R 1/00
See application file for complete search history.

(56) References Cited

U.S. PATENT DOCUMENTS

| | | | |
|---|---|---|---|
| 5,528,481 A | 6/1996 | Caldeira et al. | |
| 8,310,846 B2 | 11/2012 | Piazzesi | |
| 8,917,068 B2 | 12/2014 | Chen et al. | |
| 9,331,588 B2 | 5/2016 | Chen | |
| 9,664,713 B2 | 5/2017 | Sambucco et al. | |
| 9,762,113 B2 | 9/2017 | Chen et al. | |
| 2004/0218405 A1* | 11/2004 | Yamada | H02M 3/335 363/18 |
| 2008/0266911 A1* | 10/2008 | Han | H02M 3/156 363/50 |
| 2010/0039735 A1* | 2/2010 | Trescases | H02M 3/1588 361/18 |
| 2015/0078041 A1 | 3/2015 | Huang | |
| 2015/0311810 A1 | 10/2015 | Chen et al. | |
| 2016/0241145 A1* | 8/2016 | Matsuura | H02M 3/156 |
| 2017/0047853 A1 | 2/2017 | Chen et al. | |
| 2019/0068046 A1* | 2/2019 | Xue | H02M 1/08 |
| 2019/0305671 A1* | 10/2019 | Matsuura | H02M 1/083 |

* cited by examiner

*Primary Examiner* — Jermele M Hollington
*Assistant Examiner* — Temilade S Rhodes-Vivour

(57) ABSTRACT

A current detection circuit can include: a detection power switch coupled to a power switch to be detected; a current control circuit configured to control voltages of power terminals of the detection power switch in order to generate a detection current flowing through the detection power switch when the power switch is on; and where a flowing direction of the detection current is consistent with a flowing direction of a current flowing through the power switch.

12 Claims, 10 Drawing Sheets

CURRENT DETECTION CIRCUIT AND POWER CONVERTER

RELATED APPLICATIONS

This application claims the benefit of Chinese Patent Application No. 201910314114.6, filed on Apr. 18, 2019, which is incorporated herein by reference in its entirety.

FIELD OF THE INVENTION

The present invention relates to the field of power electronics, and more particularly to current detection circuits and power converters.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Overcurrent protection is essential for many kinds of power converters, including AC-DC converters, DC-DC converters, DC-AC converters, and AC-AC converters. Moreover, some circuits may require precise current regulation and current feedback. Thus, a current detection can be very important. Here, a resistor detection can be used in circuits requiring the current detection. However, such current detection may introduce extra power loss, and may not be suitable for large current applications. Commonly, a current can be detected according to on-resistance Rds_on. For example, a voltage between the two power terminals of a power switch of the power converter is a product of the current flowing through the power switch and on-resistance Rds_on. Also, on-resistance Rds_on can change with different stages or temperatures, such that the current detection circuit is more complex and the accuracy of the detection current may not be sufficiently high.

Figure 1:
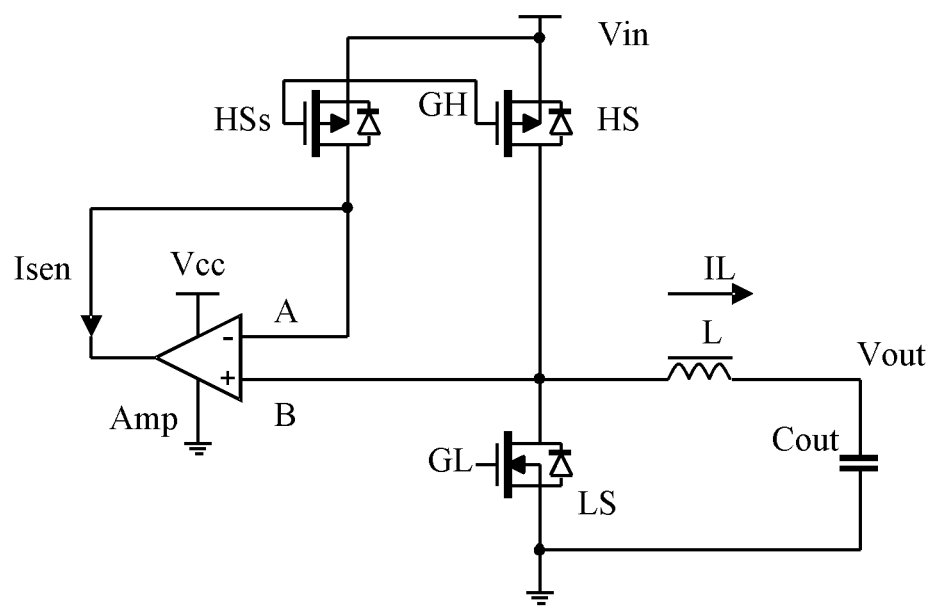
FIG. 1 is a schematic block diagram of a first example current detection circuit.
Figure 2:
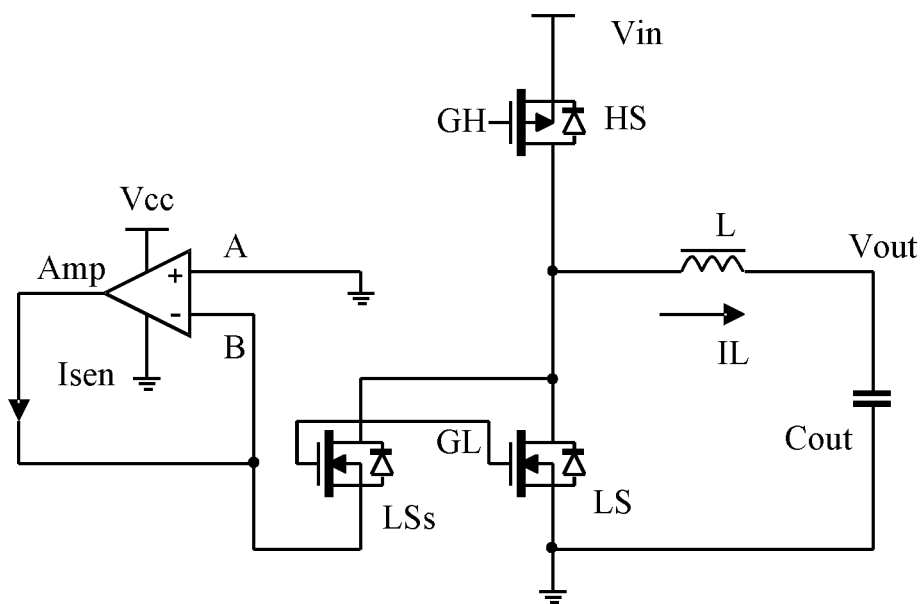
FIG. 2 is a schematic block diagram of a second example current detection circuit.

A detection power switch can be applied to the current detection. Taking a buck converter as an example, FIG. 1 shows a schematic block diagram of a first example current detection circuit. In this example, detection power switch HSs can detect a positive current flowing through an inductor of the power converter when power switch HS is on. FIG. 2 shows a schematic block diagram of a second example current detection circuit. In this example, detection power switch LSs can detect a positive current flowing through an inductor of the power converter when power switch LS is on. In one example, a type (e.g., N-type or P-type transistor) of the detection power switch is the same as a type of the power switch, and an area of the detection power switch is 1/N of an area of the power switch. In addition, the detection power switch and the power switch can be set in the same area of the circuit, in order to guarantee that the temperature of the detection power switch is the same as that of the power switch. Therefore, an on-resistance of the detection power switch can be N times that of the power switch.

In FIG. 1, gate and source terminals of detection power switch HSs can be respectively connected to gate and source terminals of power switch HS. Also, a drain terminal of detection power switch HSs can connect to inverting input terminal A of operational amplifier Amp, and non-inverting input terminal B of operational amplifier Amp can connect to a drain terminal of power switch HS. The output terminal of operational amplifier Amp can connect to inverting input terminal A of operational amplifier Amp, in order to guarantee that a voltage at the inverting input terminal of operational amplifier Amp is equal to a voltage at the non-inverting input terminal of operational amplifier Amp.

This approach may ensure that a gate-source voltage of detection power switch HSs is equal to a gate-source voltage of power switch HS, and a drain-source voltage of detection power switch HSs is equal to a drain-source voltage of power switch HS. Thus, current density of detection power switch HS s may be consistent with the current density of power switch HS. When power switch HS is on, current Isen flowing through detection power switch HSs is 1/N of inductor current IL flowing through power switch HS. In FIG. 2, the detection principle of FIG. 2 is similar to that of FIG. 1. In addition, the on-resistance of the power switch may be inversely proportional to the area of the power switch by layout, and the value of the on-resistance can be independent of process changes.

Figure 3:
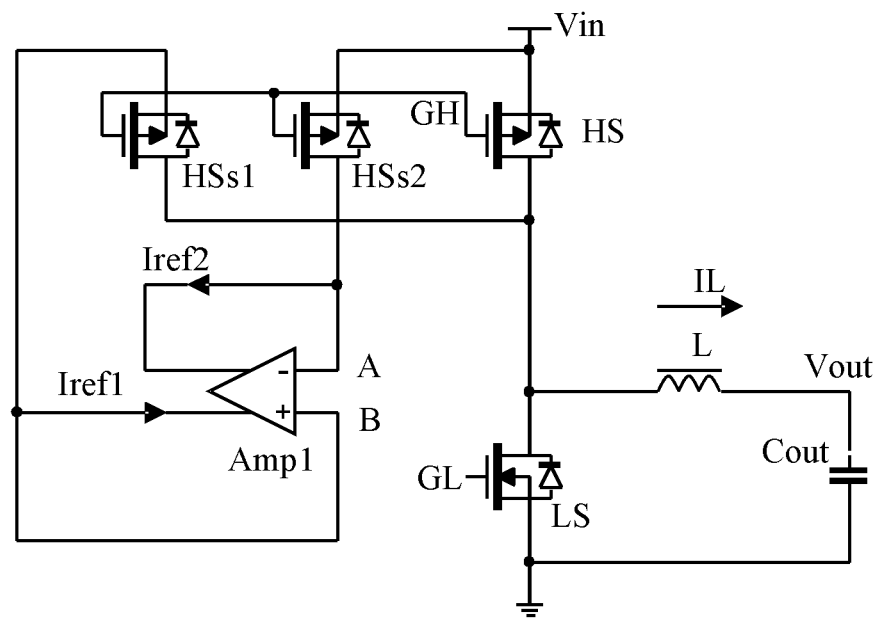
FIG. 3 is a schematic block diagram of a first example bidirectional current detection circuit.

However, these current detection circuits can merely detect a positive current. For bidirectional current detection, two detection power switch are required. Taking a buck convert as an example, FIG. 3 shows a schematic block diagram of a first example bidirectional current detection circuit. In this example, detection power switch HSs1 and detection power switch HSs2 can detect the bidirectional inductor current of the power converter when power switch HS is on. In FIG. 3, gate and drain terminals of detection power switch HSs1 can respectively be connected to gate and drain terminals of power switch HS. Gate and source terminals of detection power switch HSs2 can respectively be connected gate and source terminals of power switch HS. Inverting terminal A of difference amplifier Amp1 can connect to the drain terminal of detection power switch HSs2, and non-inverting terminal B of difference amplifier Amp1 can connect to the source terminal of detection power switch HSs1.

Figure 4:
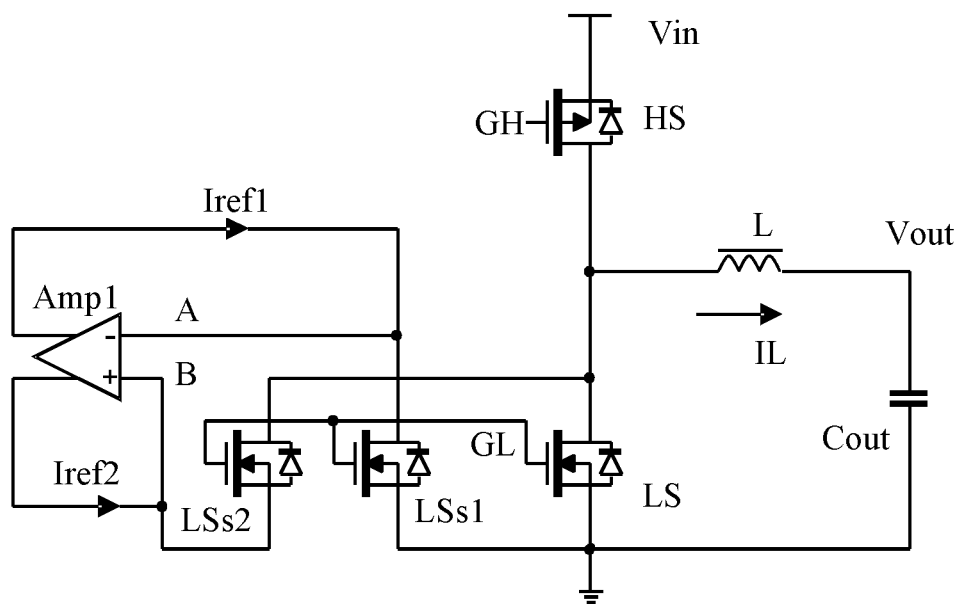
FIG. 4 a schematic block diagram of a second example bidirectional current detection circuit.

Moreover, two output terminals of difference amplifier Amp1 can connect to two input terminals of difference amplifier Amp1, such that two voltages at terminals A and B are equal. Detection power switch HSs1 can detect a negative current flowing from the drain terminal of power switch HS to the source terminal of power switch HS, and detection power switch HSs2 can detect a positive current flowing from the source terminal of power switch HS to the drain terminal of power switch HS. FIG. 4 shows a schematic block diagram of a second example bidirectional current detection circuit. In this example, detection power switch LSs1 and detection power switch LSs2 can detect the bidirectional inductor current of the power converters when power switch LS is on. In view of the above, adopting two detection power switches may result in an increase of component area and complexity of the layout of the circuit. This approach may result in difficulty in including two detection power switches for discrete power devices because of the associated large quantity of pads and wire bonding.

In one embodiment, a current detection circuit can include: (i) a detection power switch coupled to a power switch to be detected; (ii) a current control circuit configured to control voltages of power terminals of the power switch in order to generate a detection current flowing through the detection power switch when the power switch is on; and (iii) where a flowing direction of the detection current is consistent with a flowing direction of a current flowing through the power switch.

Figure 5:
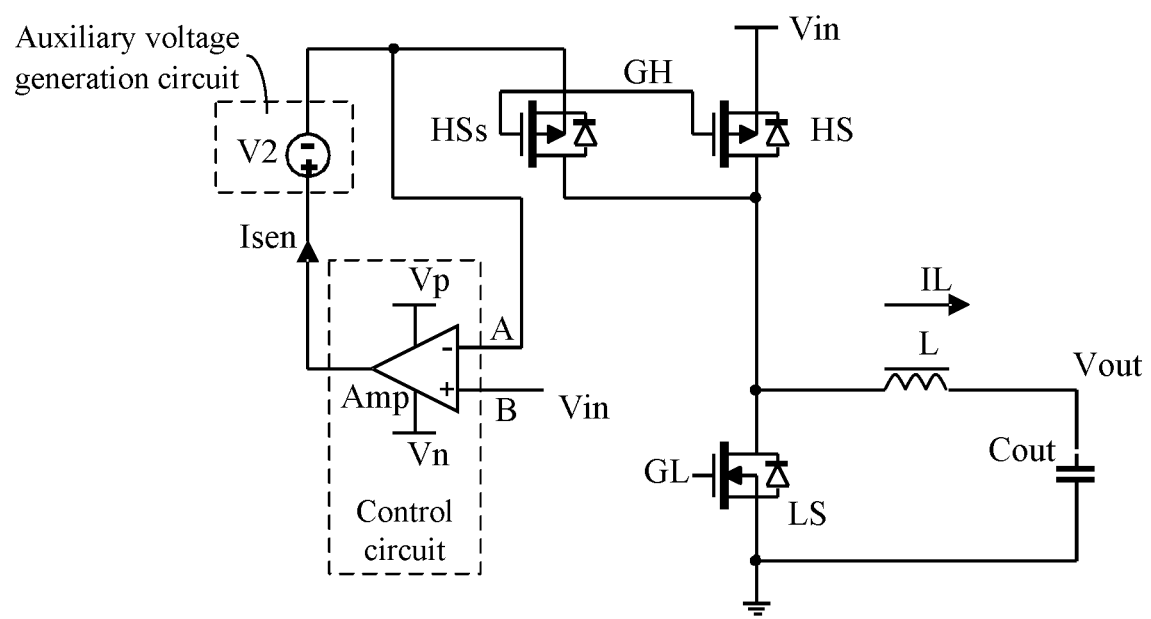
FIG. 5 is a schematic block diagram of a first example current detection circuit, in accordance with embodiments of the present invention.

Referring now to FIG. 5, shown is a schematic block diagram of a first example current detection circuit in accordance with embodiments of the present invention. Taking a buck converter as an example, the buck converter can include power switch HS and power switch LS. In particular embodiments, the detection power switch and the power switch are MOSFETs. It should be understood that other types of power switches (e.g., bipolar-junction transistors [BJTs], etc.) can also be applied to the buck converter, as long as the type of the detection power switch is the same as that of the power switch to be detected. In the example of FIG. 5, the current detection circuit can include detection power switch HSs, a control circuit, and an auxiliary voltage generation circuit. Also, a detection current flowing through detection power switch HSs may be proportional to a current flowing through power switch HS. Thus, inductor current IL can be detected. As shown in FIG. 5, the control terminal of detection power switch HSs (e.g., the gate) can connect to the control terminal of power switch HS (e.g., the gate), and one power terminal of detection power switch HSs (e.g., the drain) can connect to one power terminal of the same type of power switch HS (e.g., the drain). That is, the two power switches may be arranged in common-gate and common-drain connections.

Also, the input terminals of the control circuit can connect to the source terminal of detection power switch HSs, and the source terminal of power switch HS respectively, in order to control a voltage of the source terminal of detection power switch HSs to be equal to that of power switch HS. In this particular example, the control circuit can include operational amplifier Amp, and inverting input terminal A of operational amplifier Amp can connect to the source terminal of detection power switch HSs. Also, non-inverting input terminal B of operational amplifier Amp can connect to the source terminal of power switch HS. Because the source terminal of power switch HS is connected to input voltage Vin, the non-inverting input terminal of operational amplifier Amp can be directly connected to input voltage Vin.

In particular embodiments, the output terminal of operational amplifier Amp can connect to input terminal A of operational amplifier Amp via the auxiliary voltage generation circuit. Also, the auxiliary voltage generation circuit can generate auxiliary voltage V2, and can connect between the output terminal of operational amplifier Amp and input terminal A of operational amplifier Amp. Here, the anode of auxiliary voltage V2 can connect to the output terminal of operational amplifier Amp, and the cathode of auxiliary voltage V2 can connect to input terminal A.

In particular embodiments, the auxiliary voltage generation circuit may be provided in a buck converter topology such that bidirectional transmission of an output signal of operational amplifier Amp can be realized. Moreover, the output signal of operational amplifier Amp may be configured as detection current Isen, and the auxiliary voltage generation circuit can sink a current and provide a current. Those skilled in the art will recognize that any control circuit and auxiliary voltage generation circuit that can realize the same or similar functionality can also be utilized in certain embodiments.

As discussed above, the gate-source voltage of detection power switch HSs is the same as that of power switch HS, and the voltage at input terminal A may be controlled to be the same as the voltage at input terminal B by the control circuit. Thus, the drain-source voltage of detection power switch HSs can be the same as that of power switch HS. In addition, the type of detection power switch HSs may be the same as that of power switch HS, and the on-resistance of detection power switch HSs can be N times that of power switch HS. Thus, when driving signal GH is high, both detection power switch HSs and power switch HS may be turned on. In such a case, detection current Isen flowing through detection power switch HSs can be 1/N of inductor current IL flowing through power switch HS.

In this particular example, positive and negative power supply voltages of operational amplifier Amp are voltages Vp and Vn, respectively. Here, voltage Vn is equal to input voltage Vin, and voltage Vp is equal to the sum of input voltage Vin and voltage Vcc which is the normal operation voltage of operational amplifier Amp. In addition, the auxiliary voltage generation circuit is included. In the auxiliary voltage generation circuit, auxiliary voltage V2 can be greater than voltage Vn and less than voltage Vp. Thus, when inductor current IL is positive (e.g., the current direction shown in FIG. 5), the direction of the output signal of operational amplifier Amp is same as that of detection current Isen. Under that circumstance, the auxiliary voltage generation circuit sinks the current. At that time, the difference between voltage Vp and auxiliary voltage V2 is positive such that positive detection current Isen can be transmitted. When inductor current IL is negative (e.g., opposite to the current direction shown in FIG. 5), the direction of the output signal of operational amplifier Amp is same as that of reverse detection current Isen. Under that circumstance, the auxiliary voltage generation circuit provides the current. At that time, the difference between voltage Vn and auxiliary voltage V2 is negative such that reverse detection current Isen can be transmitted. Because the positive inductor current is much greater than the negative inductor current, the auxiliary voltage generation circuit can be required to have sufficient ability to sink current in the example of FIG. 5.

Figure 6:
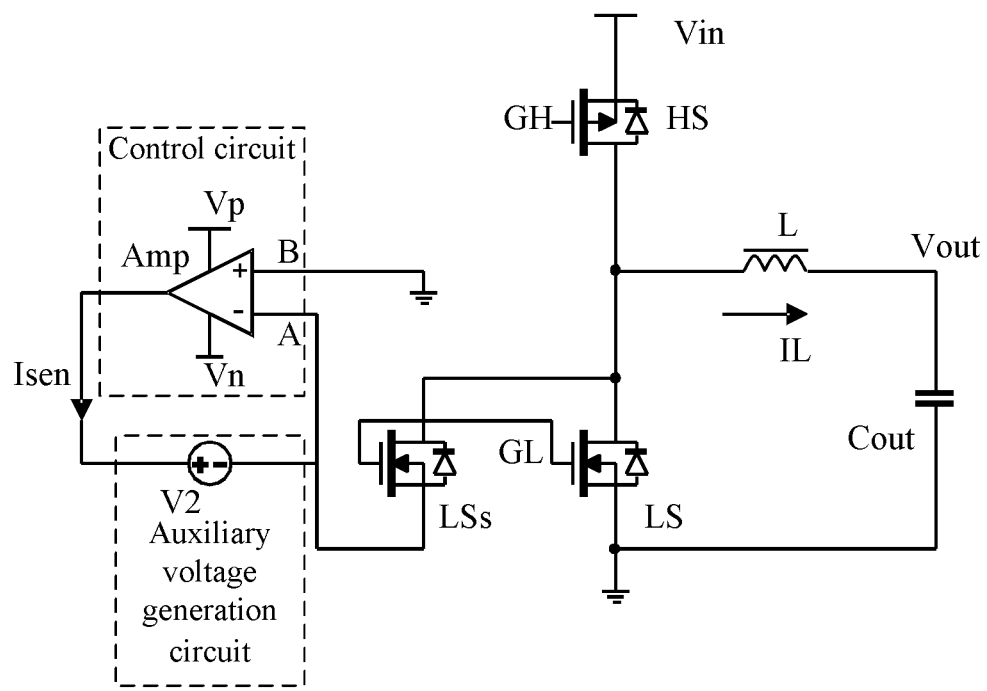
FIG. 6 is a schematic block diagram of a second example current detection circuit, in accordance with embodiments of the present invention.

Referring now to FIG. 6, shown is a schematic block diagram of a second example current detection circuit in accordance with embodiments of the present invention. In this particular example, the current detection circuit can include detection power switch LSs, a control circuit, and an auxiliary voltage generation circuit. Also, a detection current flowing through detection power switch LSs may be proportional to a current flowing through power switch LS, and thus inductor current IL can be detected. As shown in FIG. 6, the control terminal of detection power switch LSs (e.g., the gate) can connect to the control terminal of power switch LS (e.g., the gate) and one power terminal of detection power switch LSs (e.g., the drain) can connect to one power terminal of the same type of power switch LS (e.g., the drain).

Also, the input terminals of the control circuit can connect to the source terminal of detection power switch LSs and the source terminal of power switch LS, respectively, in order to control a voltage of the source terminal of detection power switch LSs to be equal to that of power switch LS. In this particular example, the control circuit can include operational amplifier Amp, and inverting input terminal A of operational amplifier Amp and non-inverting input terminal B of operational amplifier Amp can connect to the source terminal of detection power switch LSs and the source terminal of power switch LS, respectively. Because the source terminal of power switch HS can connect to ground, the non-inverting input terminal of operational amplifier Amp can be directly connected to the ground.

For example, the output terminal of operational amplifier Amp can be coupled to input terminal A of operational amplifier Amp via the auxiliary voltage generation circuit. Also, the auxiliary voltage generation circuit can generate auxiliary voltage V2, and can connect between the output terminal of operational amplifier Amp and input terminal A of operational amplifier Amp. Here, the anode of auxiliary voltage V2 can connect to the output terminal of operational amplifier Amp, and the cathode of auxiliary voltage V2 can connect to input terminal A. In particular embodiments, the auxiliary voltage generation circuit may be included in the buck converter such that bidirectional transmission of an output signal of operational amplifier Amp can be realized. Moreover, the output signal of operational amplifier Amp is configured as detection current Isen, and the auxiliary voltage generation circuit can sink a current or provide a current. Those skilled in the art will recognize that any control circuit and auxiliary voltage generation circuit that can realize the same or similar functionality as above may also be utilized in certain embodiments.

As discussed above, the gate-source voltage of detection power switch LSs is the same as that of power switch LS, and the drain-source voltage of detection power switch LSs is the same as that of power switch LS. In addition, the type of detection power switch LS s can be the same as that of power switch LS, and the on-resistance of detection power switch LSs may be N times that of that of power switch LS. Thus, when driving signal GL is high, both detection power switch LSs and power switch LS can be turned on. In such a case, detection current Isen flowing through detection power switch LSs may be 1/N of inductor current IL flowing through power switch LS.

The positive power supply voltage and the negative power supply voltage of operational amplifier Amp are voltages Vp and Vn, respectively. In this particular example voltage Vp can be equal to voltage Vcc which is the normal operation voltage of operational amplifier Amp, and voltage Vn may be zero. Moreover, the auxiliary voltage generation circuit can be included in the circuit. In the auxiliary voltage generation circuit, auxiliary voltage V2 may be greater than voltage Vn and less than voltage Vp. Thus, when inductor current IL is positive (e.g., the current direction shown in FIG. 6), the direction of the output signal of operational amplifier Amp can be the same as that of detection current Isen.

Under that circumstance, the auxiliary voltage generation circuit sinks the current. At that time, the difference between voltage Vp and auxiliary voltage V2 is positive, such that positive detection current Isen can be transmitted. When inductor current IL is negative (e.g., opposite to the current direction shown in FIG. 6), the direction of the output signal of operational amplifier Amp is the same as that of negative detection current Isen. Under that circumstance, the auxiliary voltage generation circuit provides the current. At that time, the difference between voltage Vn and auxiliary voltage V2 is negative such that negative detection current Isen can be transmitted. Because the positive inductor current is much greater than the negative inductor current, the auxiliary voltage generation circuit can be required to have sufficient ability to sink current in the example of FIG. 6.

Figure 7:
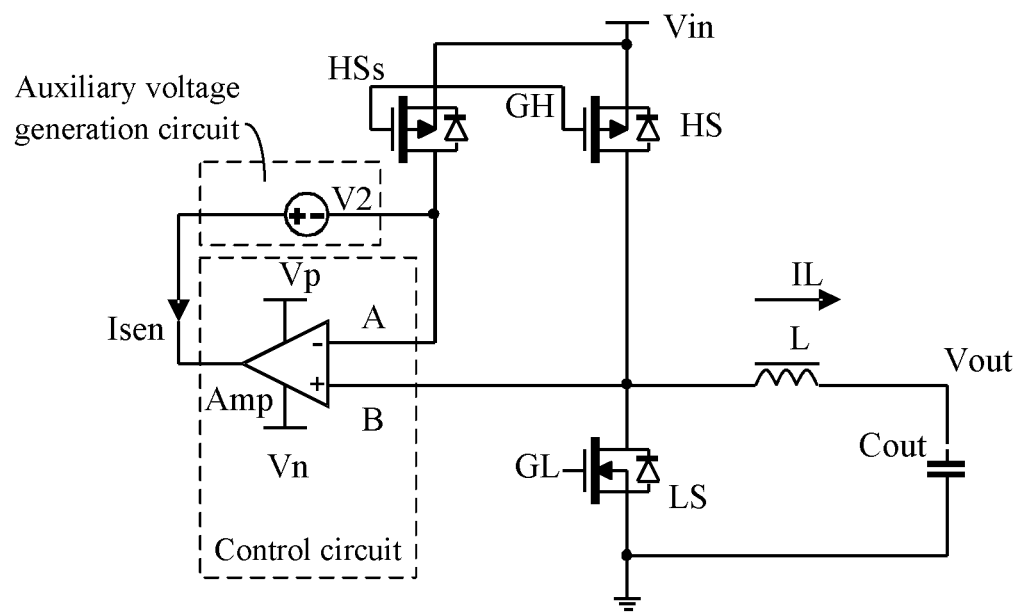
FIG. 7 is a schematic block diagram of a third example current detection circuit, in accordance with embodiments of the present invention.

Referring now to FIG. 7, shown is a schematic block diagram of a third example current detection circuit in accordance with embodiments of the present invention. In this particular example, the current detection circuit can include detection power switch HSs, a control circuit, and an auxiliary voltage generation circuit. Also, a detection current flowing through detection power switch HSs may be proportional to a current flowing through power switch HS, and thus inductor current IL can be detected. As shown in FIG. 7, the control terminal of detection power switch HSs (e.g., the gate) can connect to the control terminal of power switch HS (e.g., the gate), and one power terminal of detection power switch HSs (e.g., the source) can connect to one power terminal of the same type of power switch HS (e.g., the source).

Also, the input terminals of the control circuit can connect to the drain terminal of detection power switch HS s and the drain terminal of power switch HS, respectively, in order to control a voltage of the drain terminal of detection power switch HSs to be equal to that of power switch HS. In this particular example, the control circuit can include operational amplifier Amp, and inverting input terminal A of operational amplifier Amp and non-inverting input terminal B of operational amplifier Amp can connect to the drain terminals of detection power switch HSs and power switch HS, respectively.

In particular embodiments, the output terminal of operational amplifier Amp can be coupled to input terminal A of operational amplifier Amp via the auxiliary voltage generation circuit. Also, the auxiliary voltage generation circuit can generate auxiliary voltage V2, and can connect between the output terminal of operational amplifier Amp and input terminal A of operational amplifier Amp. Here, the anode of auxiliary voltage V2 can connect to the output terminal of operational amplifier Amp, and the cathode of auxiliary voltage V2 can connect to input terminal A. In particular embodiments, the auxiliary voltage generation circuit may be provided in the buck converter such that bidirectional transmission of an output signal of operational amplifier Amp can be realized. Moreover, the output signal of operational amplifier Amp can be configured as detection current Isen, and the auxiliary voltage generation circuit can sink a current and provide a current.

As discussed above, the gate-source voltage of detection power switch HSs may be the same as that of power switch HS, and the drain-source voltage of detection power switch HS s can be the same as that of power switch HS. In addition, the type of detection power switch HSs may be the same as that of power switch HS, and the on-resistance of detection power switch HSs may be N times that of that of power switch HS. Thus, when driving signal GH is high, both detection power switch HSs and power switch HS can be turned on. In such a case, detection current Isen flowing through detection power switch HSs may be 1/N of inductor current IL flowing through power switch HS.

The positive power supply voltage and the negative power supply voltage of operational amplifier Amp are voltages Vp and Vn respectively. Here, voltage Vp can be equal to the sum of input voltage Vin and voltage Vcc which is the normal operation voltage of operational amplifier Amp, and voltage Vn can be Vin. Moreover, the auxiliary voltage generation circuit can be included in the circuit. In the example auxiliary voltage generation circuit, auxiliary voltage V2 may be greater than voltage Vn and less than voltage Vp. Thus, when inductor current IL is positive (e.g., the current direction shown in FIG. 7), the direction of the output signal of operational amplifier Amp may be same as that of detection current Isen.

Under that circumstance, the auxiliary voltage generation circuit can provide the current, which is different as compared of FIG. 5. At that time, the difference between auxiliary voltage V2 and voltage Vn can be positive such that positive detection current Isen can be transmitted. When inductor current IL is negative (e.g., opposite to the current direction shown in FIG. 7), the direction of the output signal of operational amplifier Amp may be the same as that of negative detection current Isen. Under that circumstance, the auxiliary voltage generation circuit sinks the current. At that time, the difference between voltage Vp and auxiliary voltage V2 is positive such that negative detection current Isen can be transmitted. Because the positive inductor current is much greater than the negative inductor current, the auxiliary voltage generation circuit can be required to have sufficient ability to source current and does not need sufficient ability to sink current in the example of FIG. 7.

Figure 8:
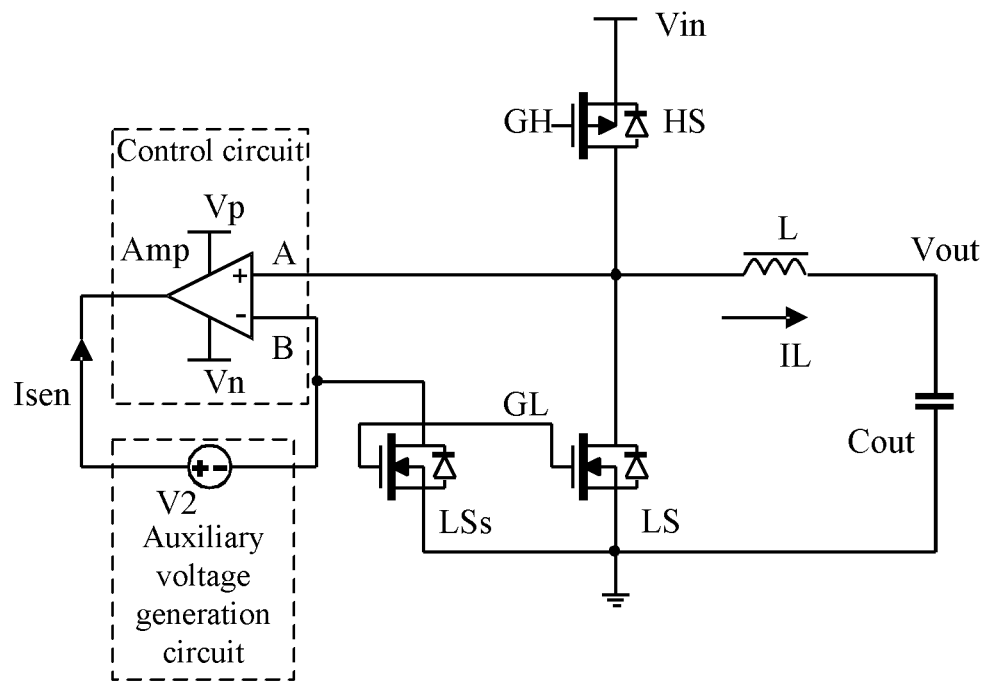
FIG. 8 is a schematic block diagram of a fourth example current detection circuit, in accordance with embodiments of the present invention.

Referring now to FIG. 8, shown is a schematic block diagram of a fourth example current detection circuit in accordance with embodiments of the present invention. In this particular example, the detection current flowing through detection power switch LSs is proportional to the current flowing through power switch LS.

Figure 9:
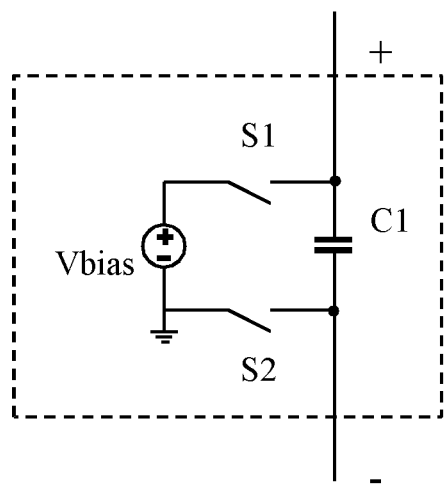
FIG. 9 is a schematic block diagram of an example auxiliary voltage generation circuit, in accordance with embodiments of the present invention.

Referring now to FIG. 9, shown is a schematic block diagram of an example auxiliary voltage generation circuit in accordance with embodiments of the present invention. In this particular example, the auxiliary voltage generation circuit can include voltage source Vbias, switch S1, switch S2, and capacitor C1. Voltage source Vbias may have the ability to sink current and source current. Also, the capacitance of capacitor C1 can be sufficiently large in order to guarantee that the voltage across capacitor C1 remains within the range from voltage Vn to voltage Vp. For example, a clamping circuit can be coupled between the two terminals of capacitor C1, in order to improve the ability to sink current. In such a case, the voltage of capacitor C1 can be clamped. Thus, it may be guaranteed that auxiliary voltage V2 is less than supply voltage Vcc regardless of the charging effect of detection current Isen on capacitor C1. It should be understood that the voltage across capacitor C1 can be also clamped by coupling a zener diode, a cascading diode, or other circuitry with voltage clamping in parallel functionality.

Figure 10:
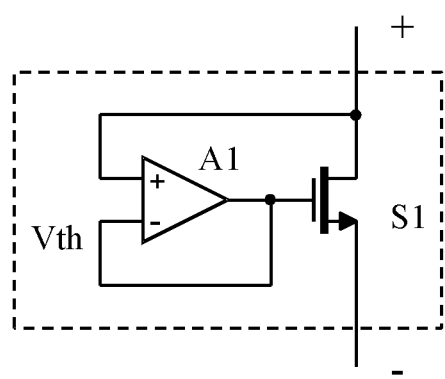
FIG. 10 is a schematic block diagram of an example clamping circuit, in accordance with embodiments of the present invention.

Referring now to FIG. 10, shown is a schematic block diagram of an example clamping circuit in accordance with embodiments of the present invention. In this particular example, a clamping circuit can be realized by operational amplifier A1. Here, the non-inverting terminal of operational amplifier A1 can connect to the drain terminal of switch S1. Also, the output terminal of operational amplifier A1 can connect to both the inverting terminal of operational amplifier A1 and to the gate terminal of switch S1. Thus, the voltage across switch S1 can be clamped at gate threshold voltage Vth, such that the voltage across capacitor C1 is clamped at the sum of gate threshold voltage Vth and voltage Vbias. Because gate threshold voltage Vth is relatively small, the voltage across capacitor C1 may remain within the range from voltage Vn to voltage Vp.

In particular embodiments, a detection power switch can be coupled to the circuit in a specific way, such that a current flowing through the detection power switch is proportional to a current flowing through the power switch to be detected. In addition, a power supply voltage of the control circuit can be properly set and an auxiliary voltage may be provided to the control circuit, in order to detect information of a positive current and a negative current of the power switch to be detected.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A current detection circuit, comprising:
    a) a detection power switch coupled to a power switch to be detected, wherein a control terminal of the detection power switch is connected to a control terminal of the power switch;
    b) a current control circuit configured to control voltages of power terminals of the detection power switch in order to generate a detection current flowing through the detection power switch when the power switch is on; and
    c) wherein a flowing direction of the detection current is consistent with a flowing direction of a current flowing through the power switch.

2. The current detection circuit of claim 1, wherein the current control circuit comprises:
    a) a control circuit configured to control a voltage of one of power terminals of the detection power switch to be equal to a voltage of the same type of power terminal of the power switch, and to generate an output signal representing the detection current; and b) an auxiliary voltage generation circuit configured to provide an auxiliary voltage for the control circuit in order to realize bidirectional transmission of the output signal of the control circuit.

3. The current detection circuit of claim 2, wherein another power terminal of the detection power switch is coupled to another same type of power terminal of the power switch.

4. The current detection circuit of claim 2, wherein a type of the detection power switch is the same as that of the power switch, and an area of the detection power switch is 1/N of an area of the power switch.

5. The current detection circuit of claim 2, wherein the control circuit comprises an operational amplifier having a first input terminal coupled to one power terminal of the detection power switch, a second input terminal coupled to the same type of power terminal of the power switch, and an output terminal coupled to the first input terminal.

6. The current detection circuit of claim 5, wherein the auxiliary voltage generation circuit is coupled between the output terminal and the first input terminal of the operational amplifier, and an anode of the auxiliary voltage is coupled to the output terminal of the operational amplifier.

7. The current detection circuit of claim 5, wherein a positive power supply voltage and a negative power supply voltage of the operational amplifier are a first voltage and a second voltage, respectively, and the auxiliary voltage is greater than the second voltage and less than the first voltage.

8. The current detection circuit of claim 7, wherein the second voltage is a voltage of one of the power terminals of the power switch, and the first voltage is the second voltage plus an operation voltage of the operational amplifier.

9. The current detection circuit of claim 2, wherein the auxiliary voltage generation circuit comprises:
 a) a capacitor; and
 b) a voltage source coupled in parallel to the capacitor, and being configured to control the capacitor to charge and discharge to the auxiliary voltage when the power switch is turned off.

10. The current detection circuit of claim 9, wherein the auxiliary voltage generation circuit further comprises a clamping circuit coupled in parallel to the capacitor, and being configured to control a voltage across the capacitor to be less than a difference between the first voltage and the second voltage.

11. The current detection circuit of claim 2, wherein the detection power switch and the power switch are both field-effect transistors (FETs).

12. A power converter, comprising the current detection circuit of claim 1, and a power stage circuit having the power switch to be detected.

\* \* \* \* \*